(12) United States Patent
Liu

(10) Patent No.: US 10,490,589 B1
(45) Date of Patent: Nov. 26, 2019

(54) IMAGE SENSOR MODULE AND METHOD FOR FORMING THE SAME

(71) Applicant: Ningbo Semiconductor International Corporation, Ningbo (CN)

(72) Inventor: Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 16/159,382

(22) Filed: Oct. 12, 2018

Related U.S. Application Data

(63) Continuation of application No. PCT/CN2018/106870, filed on Sep. 21, 2018.

(51) Int. Cl.
| | | |
|---|---|---|
| H01L 21/00 | (2006.01) | |
| H01L 27/146 | (2006.01) | |
| G02B 7/02 | (2006.01) | |
| H01L 23/00 | (2006.01) | |
| H04N 5/225 | (2006.01) | |

(52) U.S. Cl.
CPC .......... *H01L 27/14634* (2013.01); *G02B 7/02* (2013.01); *H01L 24/94* (2013.01); *H01L 27/1469* (2013.01); *H01L 27/14618* (2013.01); *H01L 27/14625* (2013.01); *H01L 27/14687* (2013.01); *H04N 5/2254* (2013.01); *H01L 2224/83894* (2013.01); *H01L 2225/06513* (2013.01); *H01L 2924/14* (2013.01)

(58) Field of Classification Search
CPC .............. H01L 27/14634; H01L 24/94; H01L 27/14625; H01L 27/14618; H01L 27/14687; H01L 27/1469; H01L 2224/83894; H01L 2225/06513; H01L 2924/14; H04N 5/2254; G02B 7/02

USPC .......................................................... 438/62
See application file for complete search history.

(56) References Cited

U.S. PATENT DOCUMENTS

| | | | |
|---|---|---|---|
| 7,335,870 B1 | 2/2008 | Yang et al. | |
| 8,212,297 B1* | 7/2012 | Law | H01L 27/14618 257/292 |
| 8,471,311 B2* | 6/2013 | Lee | H01L 27/14609 257/291 |
| 9,640,574 B2* | 5/2017 | Luan | H01L 27/14618 |
| 2006/0145325 A1 | 7/2006 | Yang et al. | |
| 2007/0010041 A1 | 1/2007 | Kang et al. | |

(Continued)

OTHER PUBLICATIONS

The World Intellectual Property Organization (WIPO) International Search Report for PCT/CN2018/106870 dated May 30, 2019 4 Pages.

*Primary Examiner* — Vu A Vu
(74) *Attorney, Agent, or Firm* — Anova Law Group, PLLC

(57) ABSTRACT

An image sensor module and method for forming the same are provided. A first side of a first wafer is attached to a first carrier wafer, the first wafer containing a plurality of first chips. A permanent bonding layer is formed on a second side of the first wafer. The permanent bonding layer includes at least one of a patterned bonding layer and a transparent bonding layer. A second chip is bonded with each first chip of the first wafer via the permanent bonding layer therebetween. The first chip is one of an image sensor chip and a transparent filter chip, the second chip is the other of the image sensor chip and the transparent filter chip, and the image sensor chip has a photosensitive region facing the transparent filter chip.

16 Claims, 8 Drawing Sheets

(56) References Cited

U.S. PATENT DOCUMENTS

| | | | |
|---|---|---|---|
| 2010/0021993 A1* | 1/2010 | Wang | B01L 3/50853 435/286.1 |
| 2011/0051390 A1* | 3/2011 | Lin | H01L 27/14618 361/818 |
| 2012/0098080 A1* | 4/2012 | Butterfield | H01L 27/14618 257/433 |

* cited by examiner

IMAGE SENSOR MODULE AND METHOD FOR FORMING THE SAME

CROSS-REFERENCES TO RELATED APPLICATIONS

This application is a continuation application of PCT Patent Application No. PCT/CN2018/106870, filed on Sep. 21, 2018, the entirety of which is incorporated herein by reference.

FIELD OF THE DISCLOSURE

The present disclosure generally relates to the field of image sensors and, more particularly, relates to image sensor modules and methods for forming the same.

BACKGROUND

Camera modules are widely used in various mobile terminals, such as mobile phones, personal digital assistants, and laptops. Conventional camera modules are often formed by first attaching a chip of a complementary metal oxide semiconductor (CMOS) image sensor on a printed circuit board (PCB). Then, a holder is used to hold an infrared (IR) filter. The holder and the IR filter together are bonded with the image sensor by a dispensing process. Finally, a motor and a lens are mounted on the holder.

Problems arise, however, because the image sensor attached to the PCB is directly exposed to the ambient environment and its photosensitive area may be easily contaminated during packaging. Such contaminations may cause imaging defects. In addition, after the image sensor is attached to the PCB, the holder with the held IR filter may then be bonded with the image sensor. The design of structure and size of such holder is thus constrained.

The disclosed image sensor modules and their methods are directed to solve one or more problems set forth above and other problems in the art.

BRIEF SUMMARY OF THE DISCLOSURE

According to various embodiments, there is provided a method for forming an image sensor module. In the method, a first side of a first wafer is attached to a first carrier wafer, the first wafer containing a plurality of first chips. A permanent bonding layer is formed on a second side of the first wafer. The permanent bonding layer includes at least one of a patterned bonding layer and a transparent bonding layer. A second chip is bonded with each first chip of the first wafer via the permanent bonding layer there-between. The first chip is one of an image sensor chip and a transparent filter chip, the second chip is the other of the image sensor chip and the transparent filter chip, and the image sensor chip has a photosensitive region facing the transparent filter chip.

According to various embodiments, there is also provided an image sensor module formed by the disclosed method.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
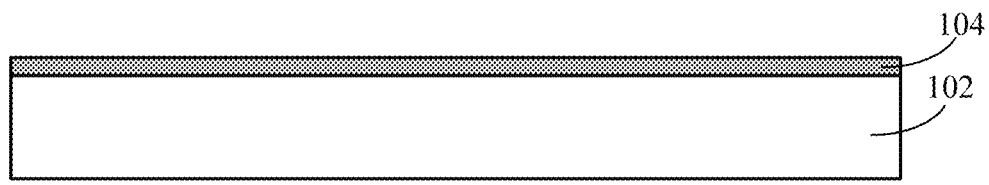
FIGS. 1-11 illustrate structures corresponding to certain stages during a method for forming an exemplary image sensor module according to various embodiments of the present disclosure.

Reference will now be made in detail to exemplary embodiments of the disclosure, which are illustrated in the accompanying drawings. Wherever possible, the same reference numbers will be used throughout the drawings to refer to the same or like parts.

The present disclosure provides image sensor modules and methods for forming the image sensor modules. For example, a first wafer may contain a plurality of first chips, e.g., having a predetermined distance between adjacent first chips. The first wafer may have a first side. The first side (e.g., backside) may be attached to a carrier wafer. A permanent bonding layer may be formed on a second side (e.g., second side) of the first wafer. The permanent bonding layer may include at least one of a patterned bonding layer and a transparent bonding layer. A second chip may be bonded with each first chip of the first wafer via the permanent bonding layer there-between.

In various embodiments, the first chip is one of an image sensor chip and a transparent filter chip. The second chip is the other of the image sensor chip and the transparent filter chip. The image sensor chip has a photosensitive region facing the transparent filter chip.

For illustration purposes, the first wafer/chip is described using the image sensor wafer/chip as an example, and the second wafer/chip is described using the transparent filter wafer/chip as an example, while the first and second chips may be interchangeably configured or arranged in the disclosed image sensor modules and their methods, according to various embodiments of the present disclosure.

For example, a first side (e.g., backside) of an image sensor wafer (or a transparent filter wafer) may be attached to a carrier wafer, e.g., by a temporary bonding layer or using an electrostatic bonding process. A permanent bonding layer, such as a patterned bonding layer or a transparent bonding layer, may be formed on the image sensor wafer (or the transparent filter wafer). A transparent filter chip (or an image sensor chip) is attached onto the permanent bonding layer and thus bonded with each image sensor chip (or each transparent filter). The transparent filter chip, the image sensor chip, and the permanent bonding layer form a package structure over the carrier wafer.

In some embodiments, the carrier wafer may then be removed. The formed package structures may be transferred, transported, stored, and/or further assembled for any use as desired. For example, after removing the carrier wafer, the package structure may be placed over a printed circuit board (PCB) and a lens assembly may be mounted over the package structure to form an exemplary image sensor module. In one embodiment, the PCB can be rigid or flexible.

According to various embodiments of the present disclosure, FIGS. 1-11 illustrate structures corresponding to certain stages during a method for forming an exemplary image sensor module, while FIGS. 13-17 illustrate structures corresponding to certain stages during a method for forming another exemplary image sensor module.

Figure 12:
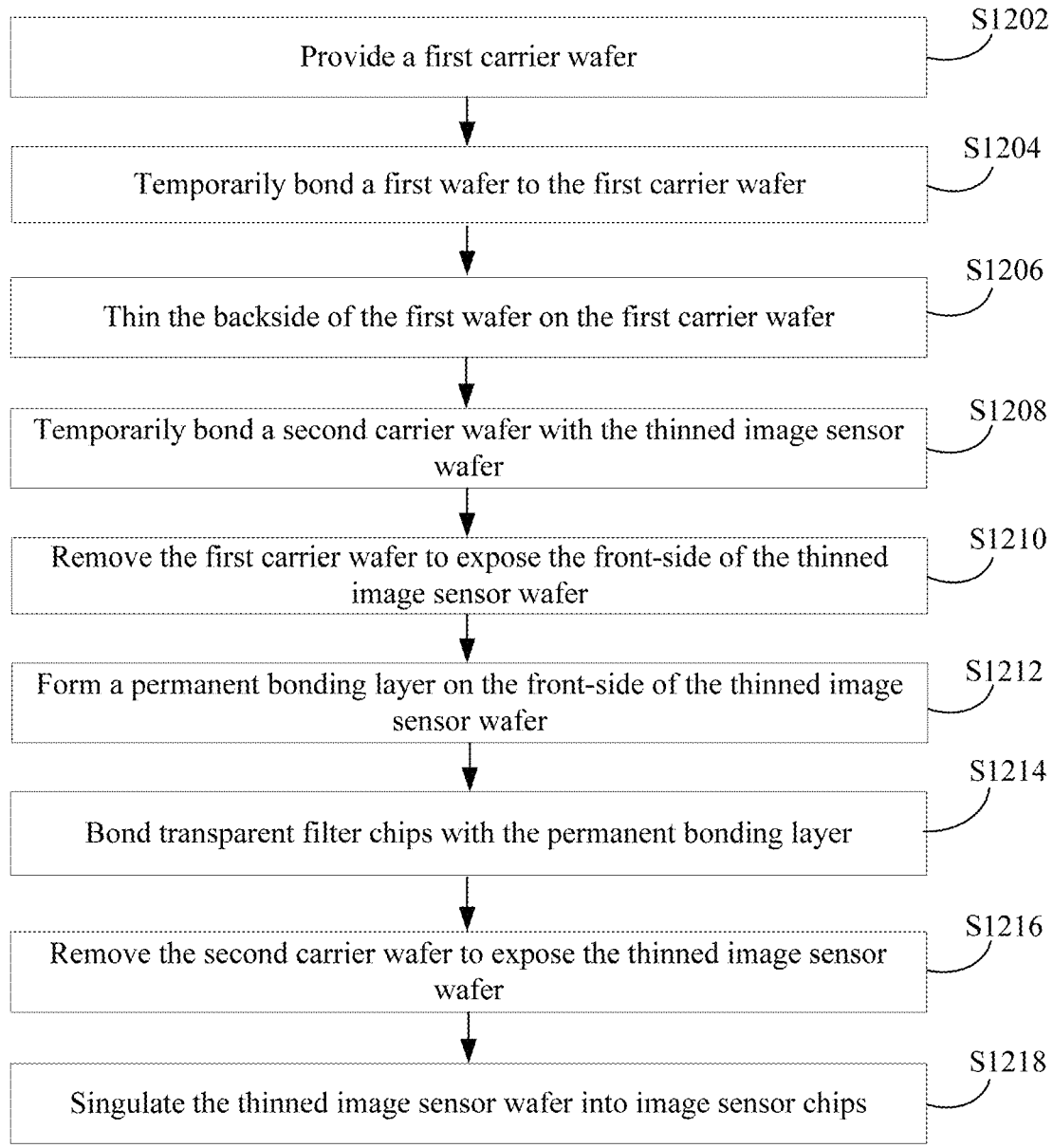
FIG. 12 illustrates an exemplary method for forming an image sensor module according to various embodiments of the present disclosure.

Referring to FIG. 12, for forming an exemplary image sensor module, a first carrier wafer is provided (e.g., in S1202). FIG. 1 illustrates a corresponding structure.

As shown in FIG. 1, a first carrier wafer 102 is provided. The first carrier wafer 102 may be made of a material including, for example, silicon, glass, silicon oxide, aluminum oxide, or combinations thereof. The first carrier wafer 102 may have a thickness ranging from about 350 μm to about 1000 μm. In some cases, the first carrier wafer 102 may have a diameter of about 200 mm, about 300 mm, etc.

Still in FIG. 1, optionally, a first temporary bonding layer 104 may be applied on the first carrier wafer 102. The first temporary bonding layer may include, for example, a thermal-release layer or any suitable first temporary bonding layer that is able to provide support for the packaging process of the package structure and that may be released as needed, e.g., after forming the package structure.

The first temporary bonding layer 104 may provide an adhesive mechanism capable of adhering chips/dies/wafers onto the first carrier wafer 102. The first temporary bonding layer 104 may be applied to the first carrier wafer 102, for example, using a lamination process, a coating process, a printing process, etc. The first temporary bonding layer 104 may have a thickness ranging from about 50 μm to about 150 μm. The first temporary bonding layer 104 may include a polymer, such as a thermoplastic or a thermos-elastic material. The first temporary bonding layer 104 may include a single-layered structure or a multi-layered structure.

In the embodiments when a thermal-release layer is used, the thermal-release layer may include, for example, a multi-layered structure. The multi-layered structure may include, for example, a release liner layer, a foaming adhesive layer, a polymer film such as a polyester film, a pressure sensitive layer, and/or a release liner layer, all of which may be sequentially stacked one over another. The foaming adhesive layer may become foaming when heated, which allows release or removal of, for example, the first carrier wafer from the first temporary bonding layer.

In another example, the thermal-release layer may be a thermal-release tape, having an adhesion substantially equivalent to a normal adhesive tape at room temperatures, which can be easily peeled off when required, e.g., simply by heating. Heat used for the removal can be selected, for example, about 90° C., 120° C., 150° C., 170° C., or any suitable temperature based on the material(s) used for the first temporary bonding layer 104.

Figure 2:
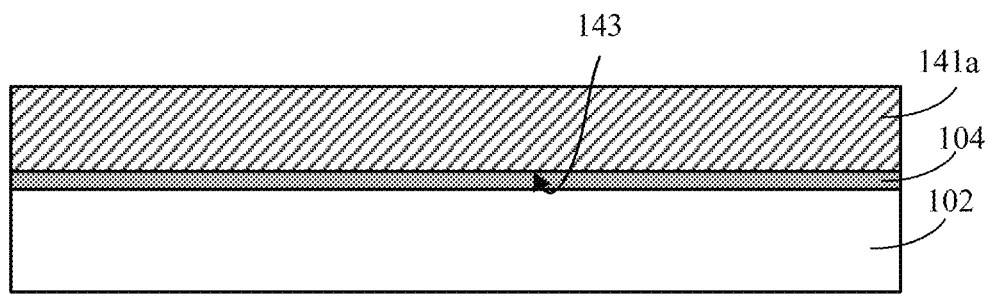

Referring back to FIG. 12, in S1204, a first wafer, such as an image sensor wafer may be attached to the first carrier wafer. FIG. 2 illustrates a corresponding structure.

As shown in FIG. 2, a first wafer, such as an image sensor wafer 141a may be attached or otherwise bonded to the first carrier wafer 102, e.g., using the first temporary bonding layer 104.

The image sensor wafer 141a may be, for example, a CIS wafer including a CMOS image sensor (CIS) wafer or a charge-coupled device (CCD) image sensor (CIS) wafer. The image sensor wafer 141a may include any possible camera modules or integrated circuits (ICs) that have been previously manufactured, for bonding to the first carrier wafer. In this case, the first wafer 120w may include one or more layers of electrical circuitry and/or electronic functions formed thereon. For example, the first wafer 120s may include conductive lines, vias, capacitors, diodes, transistors, resistors, inductors, and/or other electrical components.

For example, the image sensor wafer 141a may include a second side, such as a front-side 143. The image sensor wafer 141a may include a plurality of image sensor chips. The front-side of each image sensor chip may include a photosensitive region and a pad region. The pad region may include, e.g., a plurality of connection pads. The pad region having a plurality of connection pads may at least partially surround the photosensitive region. The connection pads may be made of copper, gold, copper-nickel alloy, copper-silver alloy, copper-gold alloy, solder, tin-silver, or a combination thereof.

The front-side 143 of the image sensor wafer 141a may be bonded facing the first carrier wafer 102. The first side, such as a backside, of the image sensor wafer 141a may be exposed.

Various methods may be used to attach the image sensor wafer 141a to the first carrier wafer 102, depending on the bonding mechanism there-between. For example, the image sensor wafer 141a may be applied to and thus bonded with the first temporary bonding layer 104, such as a thermo-release adhesive layer by applying a pressure to the first temporary bonding layer 104, e.g., from the first carrier wafer 102 upwardly to the image sensor wafer 141a, from the image sensor wafer 141a downwardly to the first carrier wafer 102, or a combination thereof.

In an exemplary embodiment, the image sensor wafer 141a may be attached to the first temporary bonding layer 104 on the first carrier layer 102. For example, the image sensor wafer 141a may be aligned and attached to the first temporary bonding layer 104 on the first carrier layer 102 by a notch alignment with accuracy of about 50 μm to about 100 μm. The wafer bonding process may be performed at room temperature for about 3 minutes to about 10 minutes under a vacuum pressure of about 1E-5 mBar to about 100 mBar for holding the first carrier layer 102, while a pressure between the image sensor wafer 141a and the first carrier layer 102 is about 1500N to about 7000N.

In some embodiments, the first temporary bonding layer 104 may be omitted (not illustrated), for example, when other bonding process, such as an electrostatic bonding process, is used for temporarily bonding the image sensor wafer 141a with the first carrier wafer 102 without using any bonding layer.

In the exemplary electrostatic bonding process, the first carrier wafer may be connected to a positive electrode of a power supply, and the image sensor wafer may be connected to a negative electrode of the power supply. A voltage may then be applied. The image sensor wafer/first carrier wafer may be heated. When the voltage is applied, a depletion layer may be formed on the surface of the image sensor wafer adjacent to the first carrier wafer (such as a silicon wafer). A large electrostatic attraction between the first carrier wafer and the image sensor wafer may bring the two into close contact for the bonding.

Figure 3:
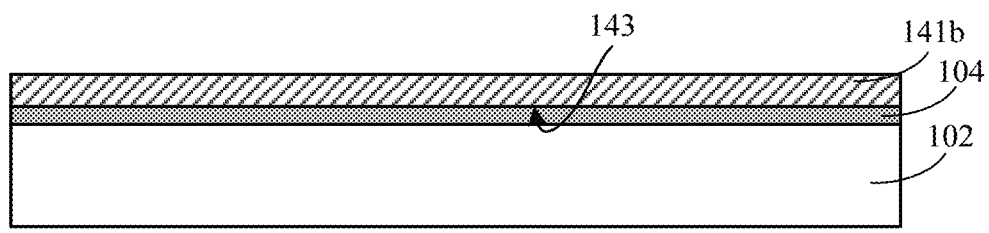

Referring back to FIG. 12, in S1206, the image sensor wafer bonded on the first carrier wafer may be thinned to provide a thinned image sensor wafer. FIG. 3 illustrates a corresponding structure.

A thinned image sensor wafer 141b may be formed on the first carrier wafer 102 by thinning the image sensor wafer 141a from the backside thereof, while the front-side of the image sensor wafer 141a is bonded with the first carrier wafer 102.

Any suitable thinning process may be used to thin the image sensor wafer 141a. For example, a grinding process or a chemical-mechanical planarization (CMP) may be used to remove a thickness portion of the image sensor wafer 141a to form the thinned image sensor wafer 141b. For example, the thinned image sensor wafer 141b may have a thickness of about 80 µm to about 200 µm.

The thinned image sensor wafer 141b may later be cut apart to form a plurality of image sensor chips.

Figure 4:
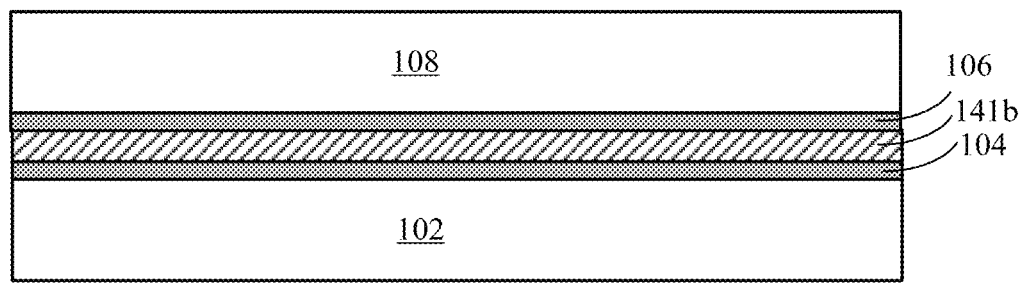

Referring back to FIG. 12, in S1208, a second carrier wafer may be temporarily bonded with the thinned image sensor wafer. FIG. 4 illustrates an exemplary structure.

As shown in FIG. 4, in this example, a second temporary bonding layer 106 may be used for bonding a second carrier wafer 108 with the thinned image sensor wafer 141b. In various embodiments, the second temporary bonding layer 106 may be formed using a material and/or a process, the same as or similar with the first temporary bonding layer 104.

In various embodiments, the second temporary bonding layer 106 may be omitted (not shown), when an electrostatic bonding process is used for electrostatically bonding the second carrier wafer with the thinned image sensor wafer.

In some embodiments, the first temporary bonding layer 104 may be used for bonding the first carrier wafer 102 with the thinned image sensor wafer 141b, while the second carrier wafer 108 may be electrostatically bonded with the thinned image sensor wafer 141b without using any temporary bonding layer. In other embodiments, the thinned image sensor wafer 141b may be electrostatically bonded with the first carrier wafer 102 without using any temporary bonding layer, while the second carrier wafer 108 may be bonded with the thinned image sensor wafer 141b via the second temporary bonding layer 106. In still other embodiments, the thinned image sensor wafer 141b may be electrostatically bonded with the first carrier wafer 102 without using any temporary bonding layer, while the second carrier wafer 108 may be electrostatically bonded with the thinned image sensor wafer 141b without using any temporary bonding layer.

As such, the thinned image sensor wafer 141b may have a front-side temporarily bonded with the first carrier wafer 102 and a backside temporarily bonded with the second carrier wafer 108.

Referring back to FIG. 12, in S1210, the first carrier wafer is removed to expose the front-side of the thinned image sensor wafer. The backside of the thinned image sensor wafer is attached on the second carrier wafer.

Figure 5:
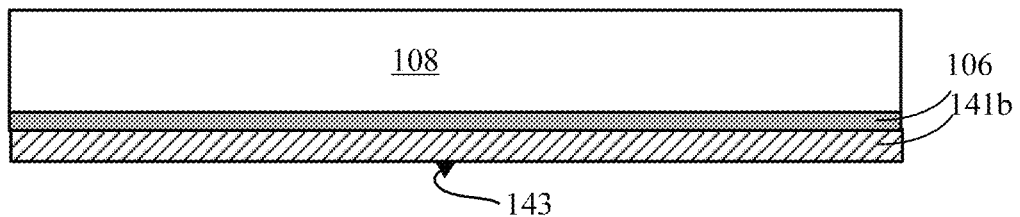

As shown in FIG. 5, the first carrier wafer 102 may be removed from the thinned image sensor wafer 141b, leaving the thinned image sensor wafer 141b on the second carrier wafer 108.

For example, depending on the materials used, the first temporary bonding layer 104 may be heated to release to de-bond the first carrier wafer 102 from the thinned image sensor wafer 141b. In one embodiment, the heating temperature is about 150° C. to about 250° C. for about 1 minute to about 10 minutes for the de-bonding.

In another example where the first temporary bonding layer is omitted and the thinned image sensor wafer is bonded with the first carrier wafer by an electrostatic bonding process, the first carrier wafer may be released from the thinned image sensor wafer by, for example, removal of the voltage applied between the transparent filters and the first carrier wafer.

Referring back to FIG. 12, in S1212, a permanent bonding layer, e.g., including a patterned bonding layer or a transparent bonding layer, may be formed on the thinned image sensor wafer.

Figure 6:
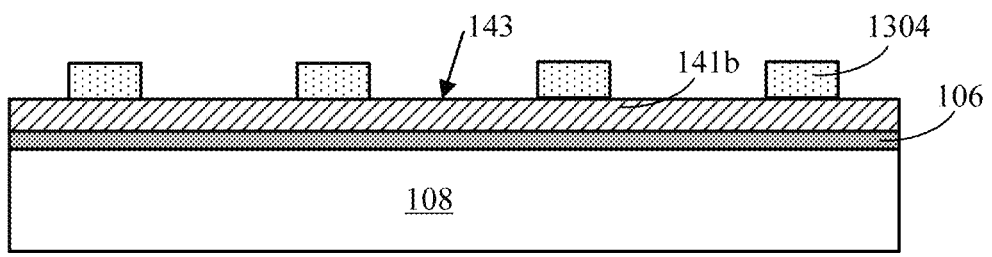
Figure 13:
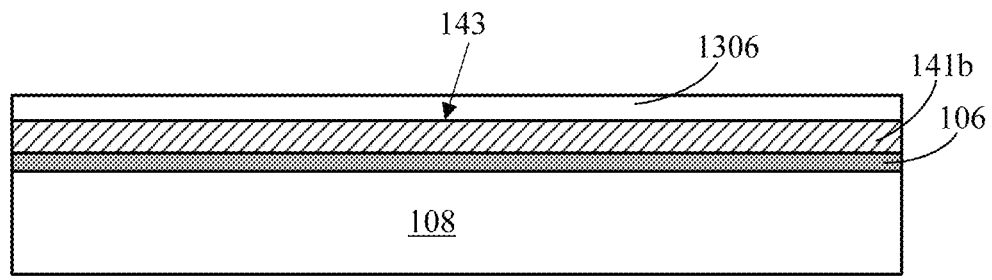
FIGS. 13-17 illustrate structures corresponding to certain stages during a method for forming another exemplary image sensor module.

In some embodiments, the permanent bonding layer may be a patterned bonding layer, e.g., as illustrated in FIG. 6; and in other embodiments, the permanent bonding layer may be a transparent bonding layer, e.g., as illustrated in FIG. 13, although any suitable bonding layer(s) may be used herein for bonding between wafer and wafer, between chip and wafer, and/or between wafer and glass forming the package structure according to various embodiments of the present disclosure.

As shown in FIG. 6, a patterned bonding layer may be formed on the thinned image sensor wafer 141b. The patterned bonding layer may include a plurality of bonding layer patterns 1304 on the thinned image sensor wafer 141b.

The plurality of bonding layer patterns 1304 may be positioned on the thinned image sensor wafer 141b in a manner such that each bonding layer pattern 1304 is on one image sensor chip later singulated from the thinned image sensor wafer 141b. For example, the plurality of bonding layer patterns 1304 may be spaced apart from one another by a predetermined distance sufficient for the packaging each image sensor chip.

In some embodiments, several dozens or several hundreds oft of the bonding layer patterns 1304 or more may be attached to the thinned image sensor wafer 141b, depending on the size of the subsequently formed image sensor chips, the size of carrier wafer, and the particular applications.

For example, the bonding layer pattern 1304 may have a cofferdam shape or any suitable shape on the thinned image sensor wafer 141b. Each bonding layer pattern 1304 may be positioned and aligned to at least surround or enclose a surface area of a photosensitive region of the corresponding image sensor chip contained in the image sensor wafer.

The bonding layer pattern 1304 may have a width, for example, greater than about 50 µm to provide sufficient support and stability for the subsequent bonding process between the transparent filter chip with an image sensor chip.

The patterned bonding layer, including the bonding layer patterns 1304, may include a single-layered structure or a multi-layered structure. The patterned bonding layer may have a thickness, based on a surface of the image sensor wafer 141b, ranging from about 20 µm to about 1000 µm, e.g., from about 20 µm to about 600 µm, or from about 20 µm to about 60 µm.

The patterned bonding layer may include a multi-layered structure having a photosensitive layer sandwiched between polymer layers including, for example, a polyethylene terephthalate (PET) layer and a polyester (PE) layer, or between any suitable polymer layers. The photosensitive layer may include monomers of photosensitive materials, photo initiators, polymer binder, and additives (e.g., promoters and dyes). The monomers are the components of the patterned bonding layer.

In some embodiments, the patterned bonding layer may be formed by a photolithographic process. For example, the patterned bonding layer may include a patterned dry film. The patterned dry film may be formed by forming a dry film on the thinned image sensor wafer and patterning the dry film by the photolithographic process to form the patterned dry film.

In an exemplary photolithographic process, a dry film may be applied on the thinned image sensor wafer 141b, under a vacuum pressure of about 50 Pa to about 500 Pa at a temperature of about 80° C. to about 130° C. The dry film may be pre-baked at about 110° C. to about 150° C. for about 80 seconds to about 200 seconds, followed by an exposure process at a radiant energy density of about 800 mJ/cm$^2$ to about 1500 mJ/cm$^2$.

After the exposure process, the patterned dry film may be further baked at a temperature of about 110° C. to about 150° C. for about 80 seconds to about 200 seconds, followed by a development process in an isopropanol alcohol (IPA) solution for about 100 to about 300 seconds, or in a propylene glycol monomethyl ether acetate (PGMEA) solution for about 60 seconds to about 200 seconds, followed by an IPA rinse process.

In other embodiments, the patterned bonding layer 1304 as illustrated in FIG. 6 may be formed by a screen printing process. Any suitable material(s) may be used to form the patterned bonding layer by the screen printing process. Non-limited examples for the materials of the patterned bonding layer 1304 include structural glue, a UV-double-sided bonding layer, a transparent glue, or any combinations thereof. The structural glue may be, for example, an epoxy adhesive, such as a two-component flexible epoxy resin adhesive.

In the embodiments when the patterned bonding layer shown in FIG. 6 is a UV-double-sided bonding layer for bonding the image sensor wafer 141*b* with, e.g., transparent filter chips, a UV-curable precursor may be coated and then patterned on the image sensor wafer 141*b*.

It should be noted that the UV-curable precursor may be patterned using any process that does not involve UV radiation and/or any heat. For example, the UV-curable precursor may not be patterned by a photolithographic process. Instead, a screen printing process or any processes without involving heat and UV radiation may be used to pattern UV-curable precursor on the image sensor wafer 141*b*.

In one embodiment, the UV-curable precursor may have the patterns similarly with the bonding layer patterns 1304 shown in FIG. 6. The patterned UV-curable precursor may later be cured and solidified, after the transparent filter chips are applied thereon. After curing, a permanent bonding may be created between the image sensor wafer 141*b* and the subsequently applied transparent filter chips (e.g., as shown in FIG. 7). Depending on the materials used for UV-curable precursor, a UV radiation at certain wavelength may be used for forming the UV-curable bonding layer.

In the embodiment when an electrostatic bonding process is used to attach the second carrier wafer 108 with the thinned image sensor wafer 141*b*, a screen printing process may be more suitably used (e.g., compared with a photolithographic process which may affect the electrostatic bonding between the thinned image sensor wafer and the second carrier wafer) for forming the patterned bonding layer as the permanent bonding layer.

Alternatively, the disclosed permanent bonding layer may include a transparent bonding layer. For example, referring to FIG. 13, a transparent bonding layer 1306 may be applied on the thinned image sensor wafer 141*b*, for example, on the front-side of the thinned image sensor wafer 141*b*. The transparent bonding layer 1306 may be a double-sided adhesive layer, prepared to receive image sensors to bond each image sensor with a corresponding transparent filter.

Referring back to FIG. 12, in S1214, a plurality of transparent filter chips may be bonded with the thinned image sensor wafer by attaching to the permanent bonding layer on the thinned image sensor wafer.

Figure 7A:
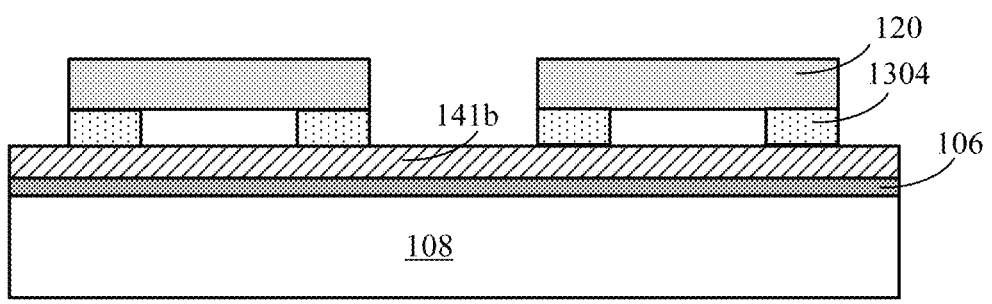
Figure 7B:
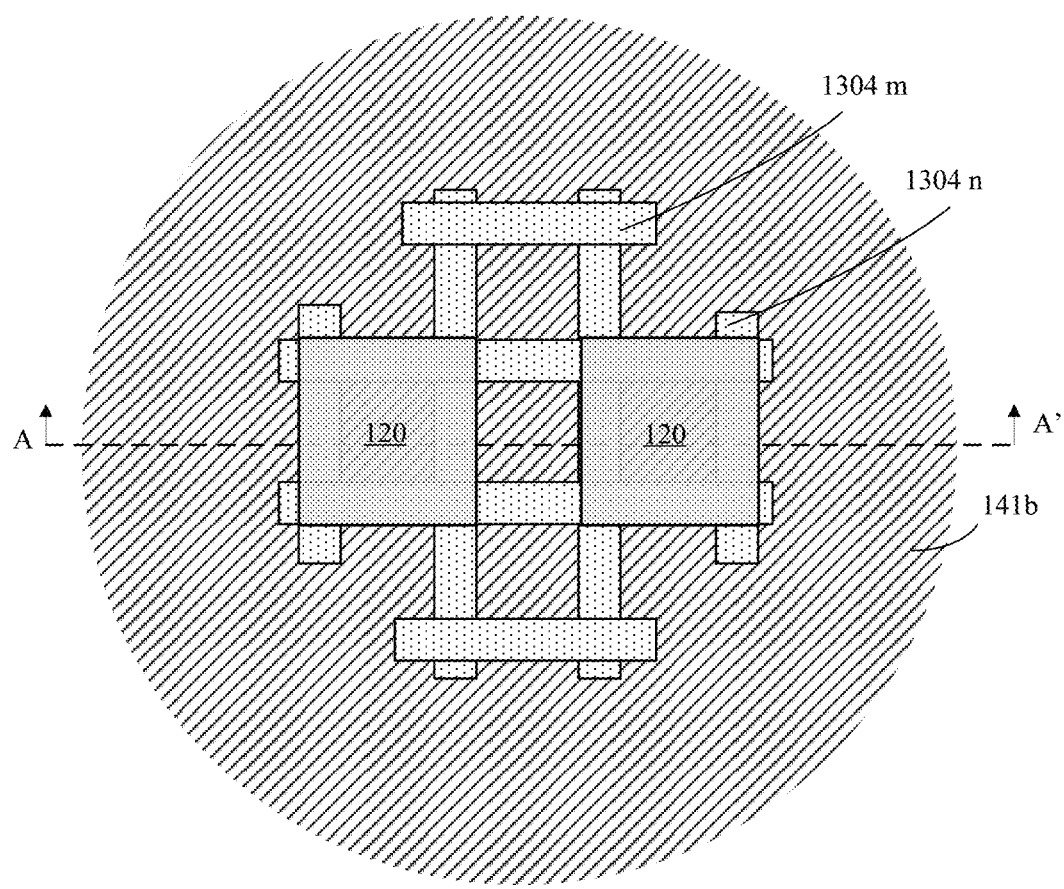
Figure 14:
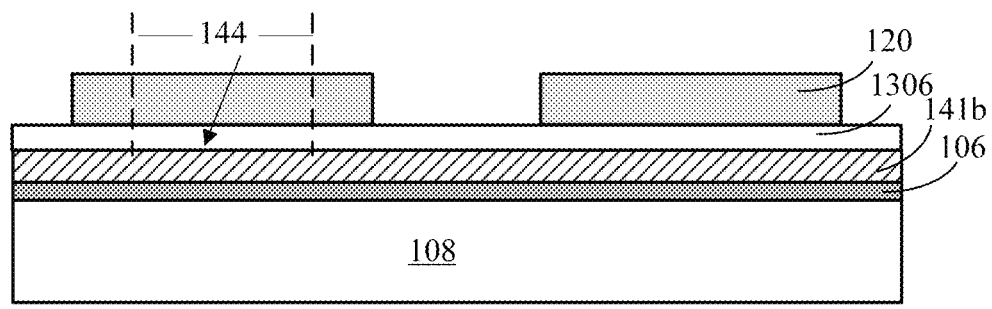

FIGS. 7A-7B and FIG. 14 illustrate corresponding, exemplary structures. As shown, FIG. 7A illustrates a cross-sectional view of a corresponding structure along A-A' direction as shown in FIG. 7B, while FIG. 7B illustrates a top view of the structure in FIG. 7A.

A plurality of transparent filter chips 120 may be bonded with the thinned image sensor wafer 141*b* by attaching to the permanent bonding layer as shown in FIGS. 7A-7B or the permanent bonding layer 1306 as shown in FIG. 1, on the thinned image sensor wafer 141*b*.

The transparent filter chip 120 may be, e.g., a glass wafer which is substantially, optically transparent. For example, the first wafer 120*w* may be an infrared (IR) glass wafer having an IR filter function.

Referring to FIG. 7A-7B, each transparent filter chip 120 may be applied to a corresponding bonding layer pattern 1304. The bonding layer patterns 1304 may be defined by intersected material patterns 1304 *m* and 1304 *n*. The material patterns 1304 *m* may be in parallel with one another. The material patterns 1304 *n* may be in parallel with one another. The material patterns 1304*m* may be non-parallel with the material patterns 1304 *n*. For example, a plurality of material patterns 1304 *m* may be arranged along a first direction and a plurality of material patterns 1304 *n* may be arranged along a second direction. The first direction and the second direction may be non-parallel with one another and may intersect with one another, such that bonding layer pattern 1304 are formed by intersected, neighboring material patterns 1304 *m/n*. Each bonding layer pattern 1304 may enclose a surface area above the thinned image sensor wafer 141*b*. Each transparent filter chip 120 may at least cover the enclosed region of the bonding layer pattern 1304 to form the disclosed package structure. The enclosed region is aligned with a photosensitive region of a corresponding image sensor chip.

The transparent filter chips 120 may be applied to the bonding layer patterns 1304, e.g., by a pick and place process or any suitable process. For example, a pick and place machine may be used to place the transparent filter chips 120 in the predetermined locations on the bonding layer patterns 1304. Pressure may also be applied, e.g., from the second carrier wafer 108 upwardly to the transparent filter chips 120, from the transparent filter chips 120 downwardly to the second carrier wafer 108, or a combination thereof.

In one embodiment, the transparent filter chips 120 may be aligned and attached with the bonding layer patterns 1304, such as dry film patterns, at a temperature of about 130° C. to about 170° C. for about 0.1 minute to about 5 minutes, such as about 0.5 minute to about 5 minutes, followed by a baking process at a temperature of about 160° C. to about 200° C. for about 0.5 hour to about 3 hours.

Alternatively, referring to FIGS. 13-14, the transparent filter chips 120 may be bonded with the thinned image sensor wafer 141*b* by attaching to the transparent bonding layer 1306 on the thinned image sensor wafer 141*b*. As such, a distance between the thinned image sensor wafer 141*b* and the transparent filter chip 120 may equal to a thickness (or less) of the transparent bonding layer 1306.

Figure 8:
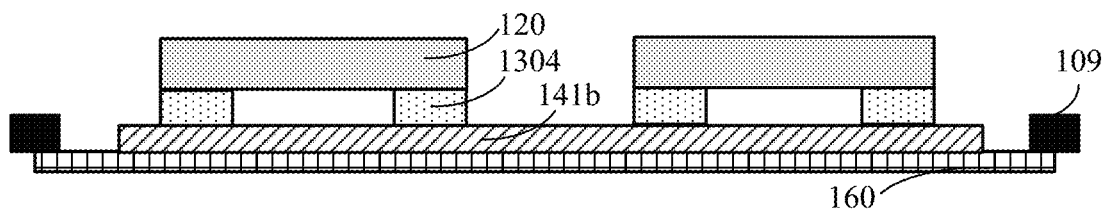

Referring back to FIG. 12, in S1216, the second carrier wafer may be removed to expose the thinned image sensor wafer. In some embodiment, the exposed thinned image sensor wafer may then be mounted onto a supporting member. FIG. 8 illustrates a corresponding structure.

As shown in FIG. 8, the second carrier wafer 108, along with the second temporary bonding layer 106, may be removed from the thinned image sensor wafer 141*b* to expose the thinned image sensor wafer 141*b*. For example, depending on the materials used, the second temporary bonding layer 106 may be heated to release the second carrier wafer 108 to de-bond the second carrier wafer 108 from the thinned image sensor wafer 141*b*. In one embodiment, the heating temperature is about 150° C. to about 250° C. for about 1 minute to about 10 minutes for the de-bonding.

In another example where the second temporary bonding layer is omitted and the thinned image sensor wafer is bonded with the second carrier wafer by an electrostatic bonding process, the second carrier wafer may be released from the thinned image sensor wafer by, for example, removal of the voltage applied between the transparent filters and the first carrier wafer.

The exposed thinned image sensor wafer 141*b* may then be mounted onto a supporting member 160, e.g., via an adhesive tape 107 on the supporting member 160 at a room temperature. In addition, a frame 109 may be placed over the supporting member 160 via the adhesive tape 107. The frame 109 may be at least partially over the supporting member 160. The frame 109 may be in an annual shape surrounding the supporting member 160.

In various embodiments, the adhesive tape 107 on the supporting member 160 may be the same or different from the first/second temporary bonding layer 104/106, although any suitable adhesive tape functioning the same may be used herein.

Referring to FIG. 12, in 51218, the thinned image sensor wafer may be singulated into a plurality of image sensor chips, e.g., on the supporting member.

Figure 9A:
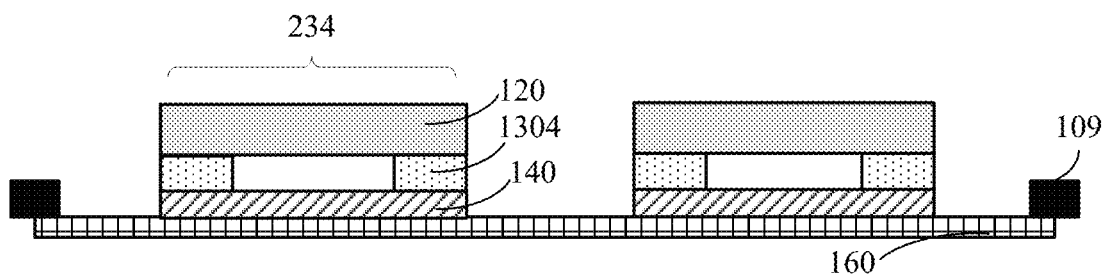
Figure 9B:
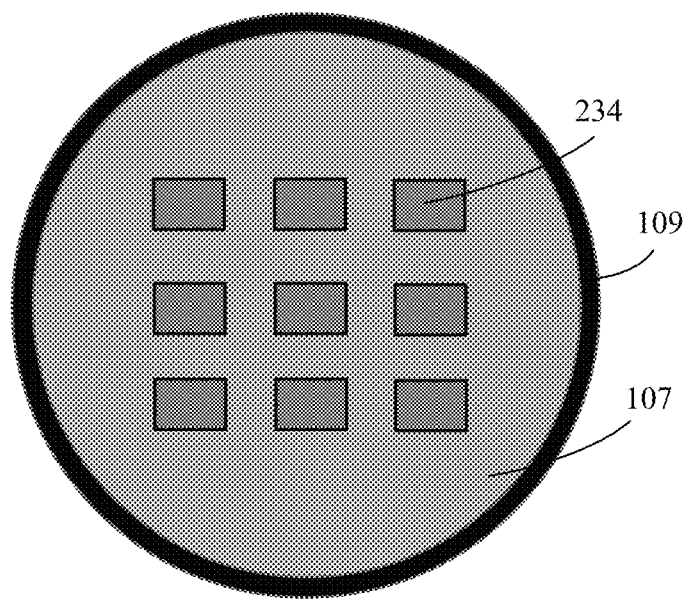

As shown in FIGS. 9A-9B, the thinned image sensor wafer 141*b* may be singulated, e.g., cutting apart, into a plurality of image sensor chips 140 on the supporting member 160. Optionally, a mechanical cutting or laser cutting may be employed to cut the image sensor wafer 141*b*. As such, a plurality of package structures 234 may be formed on the supporting member 106, e.g., for transferring, transporting, storing, and/or further assembling of the package structures 234 for a subsequent use as desired.

For example, a package structure 234 may include a transparent filter chip 120 bonded with an image sensor chip 140 (e.g., at a front-side thereof) via a bonding layer pattern 1304 there-between. The transparent filter chip 120, the bonding layer pattern 1304, the image sensor chip 140 together may enclose a cavity 24 as shown in FIG. 10.

The front-side of the image sensor chip 140 may have a photosensitive region 144 and a pad region having a plurality of connection pads 146 for connecting the image sensor chip 140 with corresponding external circuit(s). The photosensitive region 144 of the image sensor chip 140 in each package structure may be exposed within the cavity 24 and inner facing the transparent filter 120. The photosensitive region 144 of the image sensor chip 140 may thus be protected from the ambient environment, for example, may be protected from particle contaminations, starting at the early stages of the disclosed packaging process.

Figure 10:
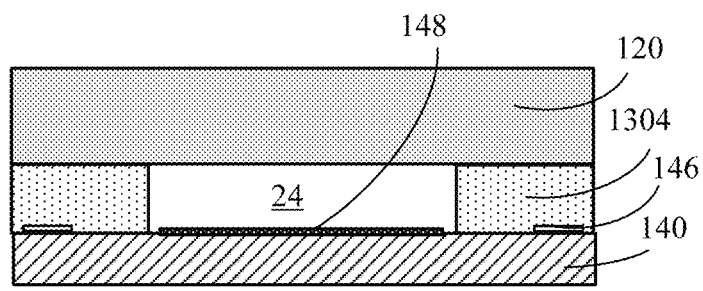

In some embodiments as shown in FIG. 10, the plurality of connection pads 146*c* may be formed on the image sensor chip 140 in the positions that, when later bonded with the transparent filter chip 120, are aligned and at least partially overlapped with a surface of the transparent filter chip 120. For example, the plurality of connection pads 146 may be at least partially sandwiched between the image sensor 140 and the transparent filter 120. The plurality of connection pads 146 may be at least partially in the bonded area between the image sensor chip 140 and the transparent filter chip 120.

In other embodiments (not shown), the connection pads may be formed on an edge area of the image sensor chip that is outside of the bonding area with the transparent filter chip 120. For example, the connection pads may be formed at least partially surrounding the bonding area between the transparent filter chip and the image sensor chip. Optionally, the package structure 234 may include an underfill layer (not shown) to protect the first and image sensors and shape the entire structure.

Further, in the package structure 234 illustrated in FIG. 10, micro lens 148 may be disposed on the photosensitive region of the image sensor chip 140 in the cavity 24, and may have an area smaller than an area of the transparent filter chip 120 exposed in the cavity 24.

Figure 15:
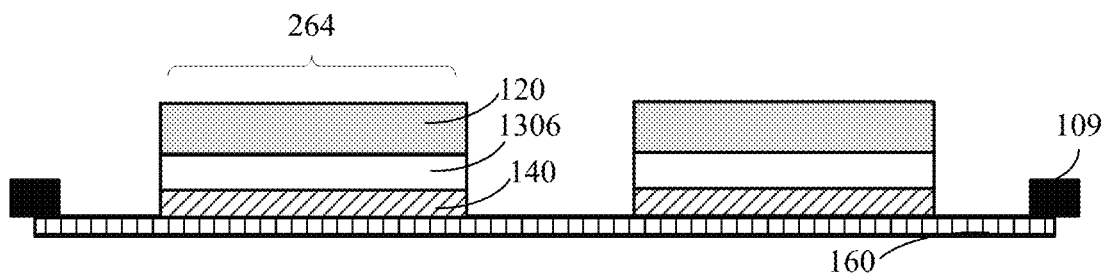
Figure 16:
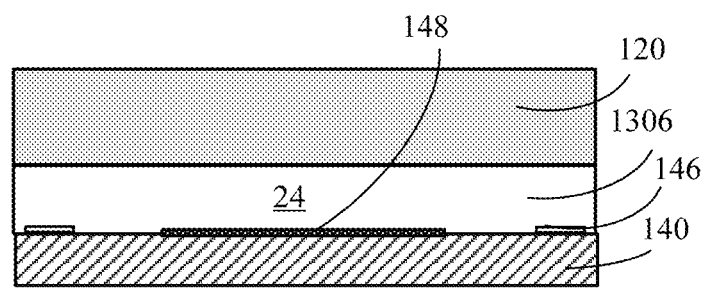

Alternatively, as shown in FIG. 15, a plurality of package structures 264 may be formed on the supporting member 160, after singulating the thinned image sensor wafer 141*b* (e.g., along with the transparent bonding layer 1306) into a plurality of images sensor chops 140. For example, as illustrated in FIG. 16, a package structure 264 may include a transparent filter chip 120 and an image sensor chip 140, bonded by a transparent bonding layer 1306. A distance between the image sensor chip 140 and the transparent filter chip 120 in the package structure 264 may equal to a thickness (or less) of the transparent bonding layer 1306. In this case, the formed package structure does not include a cavity.

A front-side of the image sensor chip 140 may have a photosensitive region 144 and a pad region, the pad region having a plurality of connection pads 146. The connection pads 146 may be used to connect the image sensor chip 140 with corresponding external circuit(s).

In one embodiment, the image sensor chip 140 may be front-side down having photosensitive region 144 aligned with a corresponding region on the transparent filter chip 120 within alignment accuracy. The photosensitive region 144 of the image sensor chip 140 may thus inner facing the transparent filter chip 120. The photosensitive region 144 of the image sensor chip 140 may be protected from the ambient environment, for example, may be protected from particle contaminations, starting at the early stages of the disclosed packaging process.

In some embodiments as shown in FIG. 16, the plurality of connection pads may be formed on the image sensor chip in the positions that, when later bonded with the transparent filter chip, are aligned and at least partially overlapped with a surface of transparent filter chip. For example, the plurality of connection pads may at least partially sandwiched between the image sensor chip 140 and the transparent filter chip 120.

In other embodiments (not shown), the connection pads may be formed on an edge area of the image sensor chip that is outside of a bonding area between the image sensor chip and the transparent filter chip. For example, the connection pads may be formed at least partially surrounding the bonding area between the transparent filter chip and the image sensor chip.

Further, in the package structure 264 illustrated in FIG. 16, micro lens 148 may be disposed on the photosensitive region of the image sensor 140, which is attached to the transparent bonding layer 1306 and facing the transparent filter chip 120, and may thus be protected from contaminations from ambient environment.

Figure 11:
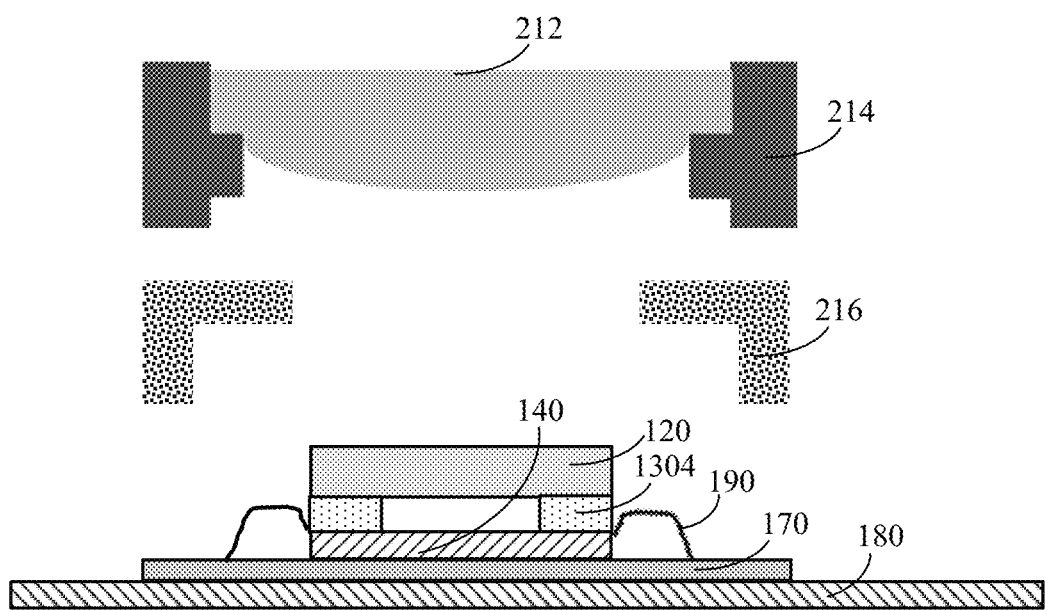
Figure 17:
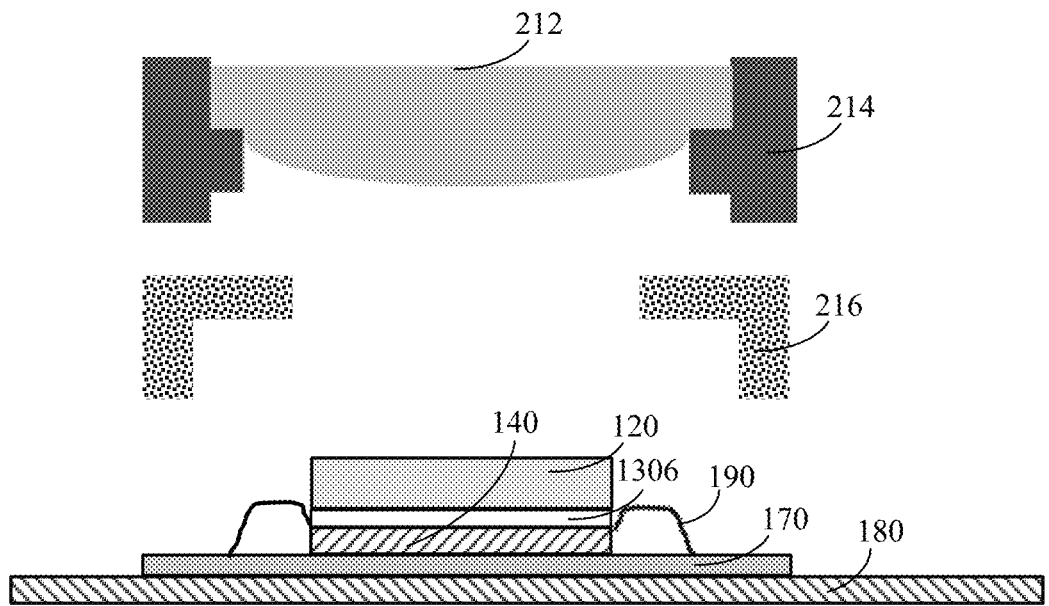

FIGS. 11 and 17 illustrate an exploded view of exemplary image sensor modules including the disclosed package structure according to various embodiments of the present disclosure. The package structures include a chip size package (CSP). Examples of the package structure may include those illustrated in FIGS. 4A-9B, 10, and 15-16.

For example, the package structure 234/264 may be placed on a connection layer 170, which may be placed on a printed circuit board (PCB) 180.

In the package structure, connection pads may be formed in the bonding area of the image sensor chip with the transparent filter chip and connected to bonding wires 190. The bonding wires 190 may provide electrical connections between the image sensor chip 140 of the package structure and the PCB 180 via the connection layer 170. Optionally, the bonding wires 190 may be covered by a protection material or a molding (not shown).

The image sensor modules in FIGS. 11 and 17 may further include a lens assembly. The lens assembly includes a lens 212, a lens barrel 214, and/or a supporting element 216. The lens barrel 214 is configured to be adjustable such that the focal length of the lens 212 may change.

The supporting element 216 may be mounted on the connection layer 170 (and/or the printed circuit board 180), over and surrounding the package structure on the connection layer 170. The supporting element 216 may be configured between the lens barrel 214 and the connection layer 170 (and/or the printed circuit board 180). The supporting element 216 may be used to mechanically support the lens barrel 214 over the disclosed package structure.

Unlike conventional holder for holding a glass chip, the supporting element 216 does not hold any chip(s) and may have a more simplified structure and reduced dimensions. For example, a height of the simplified supporting element 216 in the lens assembly of the image sensor module may be reduced, e.g., by about 0.4 mm or less. In addition, the supporting element 216 may be made of a material including, for example, a plastic, a rubber, a ceramic, and any other suitable materials.

In this manner, a package structure may be formed in chip size by first bonding a transparent filter and an image sensor together. The photosensitive region of the image sensor is inner faced to the transparent filter within each package structure, and is thus protected from contaminations from the ambient environment during subsequent processes. The yield of the package structures is therefore increased.

In addition, the disclosed modules and methods may allow use of a simplified supporting element in the lens assembly of the image sensor module, because the chips are bonded together to form the package structure first and there is no need for the supporting element to hold any chip(s).

Various embodiments also include mobile terminals, such as mobile phones, personal digital assistants, and/or laptops, which contain the disclosed image sensor modules with simplified structures and reduced sizes.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming an image sensor module, comprising:
    attaching a first side of a first wafer to a first carrier wafer, the first wafer containing a plurality of first chips, wherein attaching the first side of the first wafer to the first carrier wafer includes:
        temporarily attaching a second side of the first wafer onto a second carrier wafer using one of an electrostatic bonding process and a temporary bonding layer,
        thinning the first side of the first wafer on the second carrier wafer,
        temporarily attaching the first carrier wafer onto the first side of the first wafer after thinning using one of the electrostatic bonding process and the temporary bonding layer, and
    removing the second carrier wafer, thereby exposing the second side of the first wafer on the first carrier wafer, wherein the temporary bonding layer includes a thermal-release layer including a double-sided adhesive layer having a multi-layered structure;
    forming a permanent bonding layer on the second side of the first wafer, wherein the permanent bonding layer includes at least one of a patterned bonding layer and a transparent bonding layer; and
    bonding a second chip with each first chip of the first wafer via the permanent bonding layer there-between, wherein the first chip is one of an image sensor chip and a transparent filter chip, the second chip is the other of the image sensor chip and the transparent filter chip, and the image sensor chip has a photosensitive region facing the transparent filter chip.

2. The method according to claim 1, wherein:
    the first chip is the image sensor chip, the second side of the first chip including:
        the photosensitive region, and
        a plurality of connection pads formed on a bonding area of the first chip bonded with the permanent bonding layer that is outside of the photosensitive region.

3. The method according to claim 1, wherein:
    when the permanent bonding layer is the transparent bonding layer, a distance between the first and second chips equals to a thickness or less of the transparent bonding layer.

4. The method according to claim 3, wherein:
    the transparent bonding layer includes a transparent glue.

5. The method according to claim 1, wherein:
    when the permanent bonding layer is the patterned bonding layer,
    the first and second chips, and the patterned bonding layer together enclose a cavity, wherein the photosensitive region of the image sensor chip is exposed within the cavity.

6. The method according to claim 1, further including:
    forming the patterned bonding layer by a photolithographic process.

7. The method according to claim 6, wherein the patterned bonding layer includes a patterned dry film, formed by:
    forming a dry film on each first chip, and
    patterning the dry film by the photolithographic process to form the patterned dry film.

8. The method according to claim 1, further including:
    forming the patterned bonding layer by a screen printing process,
        wherein the patterned bonding layer includes a structural glue, a UV-double-sided bonding layer, a transparent glue, or a combination thereof.

9. The method according to claim 1, wherein:
    when the electrostatic bonding process is used, the method further includes:
    forming the permanent bonding layer on the second side of the first wafer includes a screen printing process.

10. The method according to claim 1, wherein:
    the multi-layered structure includes a foaming adhesive layer, a pressure sensitive layer, and a polymer film sandwiched between the foaming adhesive layer and the pressure sensitive layer.

11. The method according to claim 1, wherein:
when the permanent bonding layer includes a UV-double-sided bonding layer, forming the permanent bonding layer on the second side of the first wafer, and bonding the second chip with each first chip of the first wafer via the permanent bonding layer include:
    coating a UV-curable precursor on the second side of the first wafer,
    patterning the UV-curable precursor by a screen printing process corresponding to each first chip of the first wafer,
    placing the second chip on the UV-curable precursor on each first chip, and
    curing the UV-curable precursor between the first and second chips to form the UV-double-sided bonding layer as the permanent bonding layer.

12. The method according to claim 7, wherein bonding the second chip with each first chip via the permanent bonding layer includes:
    bonding the first and second chips via the patterned dry film at a temperature of about 130° C. to about 170° C. for about 0.1 minute to about 5 minutes.

13. The method according to claim 1, further including:
    after bonding the second chip, singulating the first wafer into the plurality of first chips to form a plurality of package structures on the first carrier wafer, wherein each package structure includes one first chip, one second chip, and the permanent bonding layer therebetween.

14. The method according to claim 13, further including:
    removing the first carrier wafer after bonding the second chip with each first chip or after singulating the first wafer.

15. The method according to claim 13, further including:
    mounting the first side of the plurality of first chips of the plurality of package structures to a printed circuit board (PCB), the PCB including a rigid PCB or a flexible PCB,
    wherein the plurality of first chips mounted on the PCB are image sensor chips.

16. The method according to claim 15, further including:
    mounting a lens assembly over each package structure, wherein:
    the lens assembly includes a supporting element mounted on the PCB over the package structure.

* * * * *